United States Patent
van Veldhoven

(10) Patent No.: US 12,184,308 B2
(45) Date of Patent: Dec. 31, 2024

(54) INTERFACE CIRCUIT AND METHOD FOR PROVIDING DC BIAS VOLTAGE CORRECTION

(71) Applicant: NXP B.V., Eindhoven (NL)

(72) Inventor: Robert van Veldhoven, Valkenswaard (NL)

(73) Assignee: NXP B.V., Eindhoven (NL)

( * ) Notice: Subject to any disclaimer, the term of this patent is extended or adjusted under 35 U.S.C. 154(b) by 9 days.

(21) Appl. No.: 17/822,951

(22) Filed: Aug. 29, 2022

(65) Prior Publication Data

US 2023/0421172 A1  Dec. 28, 2023

(30) Foreign Application Priority Data

Jun. 23, 2022 (EP) .................... 22180802.5

(51) Int. Cl.
*H03M 3/00* (2006.01)
*H04R 3/00* (2006.01)
*H03F 3/45* (2006.01)
*H04R 3/06* (2006.01)

(52) U.S. Cl.
CPC .............. *H03M 3/464* (2013.01); *H04R 3/00* (2013.01); *H03F 3/45475* (2013.01); *H04R 3/06* (2013.01); *H04R 2201/003* (2013.01)

(58) Field of Classification Search
CPC ........... H03M 3/464; H04R 3/00; H04R 3/06; H04R 2201/003; H03F 3/45475
See application file for complete search history.

(56) References Cited

U.S. PATENT DOCUMENTS

2007/0139238 A1  6/2007  Van Veldhoven
2018/0234763 A1*  8/2018  Ganta ................. H03F 3/45475

* cited by examiner

*Primary Examiner* — Joseph J Lauture
(74) *Attorney, Agent, or Firm* — Joanna G. Geld

(57) ABSTRACT

An interface circuit includes an analogue to digital converter having an input configured to receive an input signal having an unknown DC bias voltage via an input resistance and provide an output signal to an ADC feedback loop. The ADC feedback loop includes a digital filter arranged to digitally filter the fedback output signal. A digital to analogue converter (DAC) forming a DC feedback loop with the ADC and arranged to convert the digitally filtered fedback output signal to an analogue signal that is provided to the input of the ADC, wherein the analogue signal that is provided to the input of the ADC is arranged to include a DC bias component that is comparable to a DC bias component of a current of the input signal passing through the input resistor.

14 Claims, 5 Drawing Sheets

INTERFACE CIRCUIT AND METHOD FOR PROVIDING DC BIAS VOLTAGE CORRECTION

CROSS-REFERENCE TO RELATED APPLICATIONS

This application claims the priority under 35 U.S.C. § 119 of European Patent application no. 22180802.5, filed on 23 Jun. 2022, the contents of which are incorporated by reference herein.

FIELD OF THE INVENTION

The field of the invention relates to an interface circuit for correcting for or removing a DC bias voltage, and a method therefor. The invention is applicable to, but not limited to, interfacing and signal processing circuitry for microphones.

BACKGROUND OF THE INVENTION

Microphones are electromechanical transducers that are used to transform sound into electrical signals. There exists a wide variety of transducer technologies that are used in microphone designs, including carbon filament, piezo-electric, piezo-resistive, electromagnetic and capacitive (condenser), each of which has advantages and disadvantages. Of these the capacitive transducer is very popular due to simplicity and cost.

The capacitive or condenser microphone utilises a physical relationship between voltage (V) and capacitance (C) in a capacitor, in general a parallel-plate capacitor utilising one fixed plate and one moveable plate or 'piston'. The piston is configured such that it can move due to changes in air pressure, i.e., the pressure caused by a sound wave. A fixed charge is applied to the capacitor either by applying a fixed external DC voltage between the plate and the piston or by introducing a charged dielectric body, known as an 'electret'. between the plates. The electret is usually fixed to the non-moving plate of the capacitor, which provides the fixed charge.

In a parallel plate capacitor with a fixed charge (Q) the voltage between the plates is proportional to the capacitance (C) which is inversely proportional to the distance between the plates. Assuming that no charge can leak away, then movement of the piston towards the fixed plate will cause the capacitance of the structure to increase and the voltage between the plates to decrease. The change in voltage is then proportional to the sound pressure that moved the piston, and hence proportional to the sound. This voltage can be amplified and further processed.

FIG. 1 illustrates a simplified drawing of a known electret microphone interface circuit 100. The voltage generated by the capacitive transducer 101 is small and the output impedance is capacitive. Hence, it is necessary to buffer the output of the transducer using an amplifier with a very high input impedance in order to prevent the output of the transducer from being loaded electrically. In modern microphones this is achieved by integrating a junction field effect transistor (JFET) 106 into the microphone itself, the JFET 106 being configured as a voltage-controlled current source, which has a very high input resistance. The output voltage of the capacitive transducer 101 drives the gate of the JFET 106 and produces an output current that is proportional to the gate voltage. Thus, the FET performs the function of a voltage-controlled current source or transconductance amplifier.

Electret microphones often use high bias voltages 107 via resistor 103, for example in commercial microphones as high as 48V DC, in order to make sure that the microphone is biased properly at its most sensitive operating point. At the same time, in deep-submicron integrated circuit (IC) technologies, such as those commonly used in signal processing circuits, supply voltages are shrinking, and are commonly of the order of 1.1-1.8V. This creates a large DC mismatch between the output of the electret microphone 110, and the input range of any Analogue to Digital Converter (ADC) 109 that is used to digitize the electret microphone output signal 110.

The DC bias problem is typically solved by using a series 'blocking' capacitor 104 to AC-couple the output signal of the FET to the input of the signal processing circuit. The series capacitor 104 required to block the DC voltage 107 needs to be large, generally in the uF range (up to 10 uF). Nowadays in audio applications there are usually multiple audio channels available, which results in a lot of large external AC coupling capacitors being required. Accordingly, there is a need for a circuit that provides DC bias regulation in electret microphone interface circuitry and a method therefor.

SUMMARY OF THE INVENTION

The present invention provides a means for interfacing an output signal of an electronic circuit having a large DC offset or bias component to a circuit that uses a substantially lower voltage supply or would be substantially overloaded by the DC bias component and a method therefor, as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
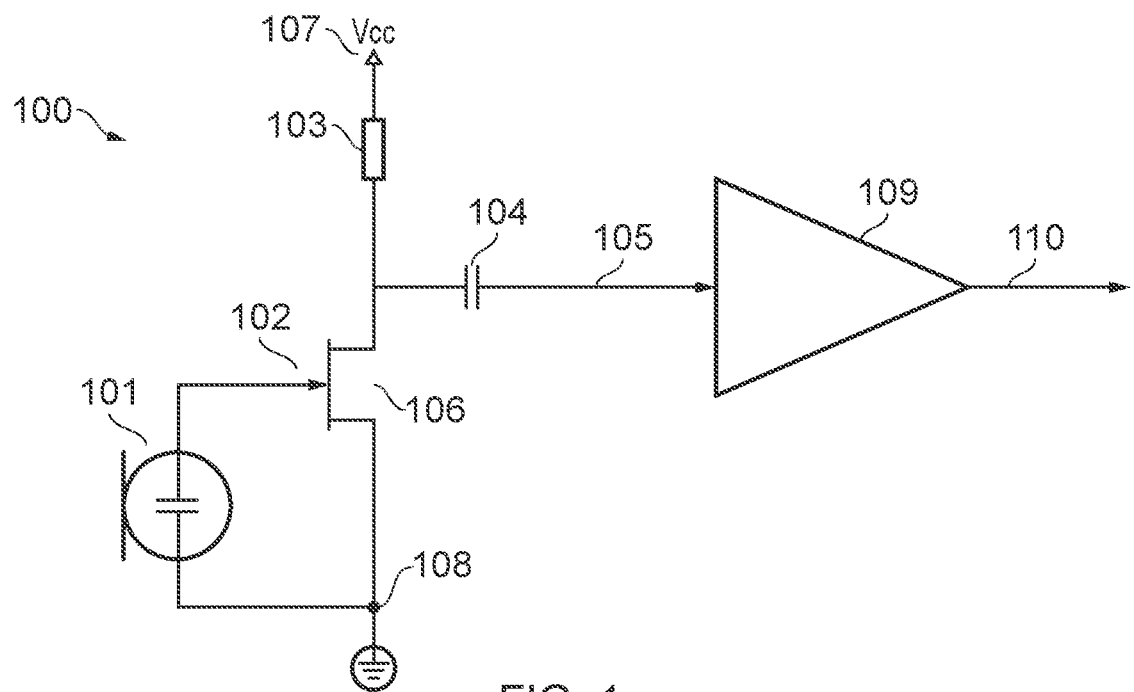
FIG. 1 illustrates a simplified drawing of a known electret microphone interface circuit.

Because the illustrated embodiments of the present invention may, for the most part, be implemented using electronic components and circuits known to those skilled in the art, details will not be explained in any greater extent than that considered necessary to understand and appreciate the underlying concepts of the present invention and, in order not to obfuscate or distract from the teachings of the present invention.

Examples of the present invention provide an interface circuit for removing an unknown DC bias voltage from an input signal, the circuit includes an input resistance arranged to provide the input signal containing an unknown DC bias voltage component to an analogue to digital converter (ADC). An output signal of the ADC is digitally filtered, converted to an analogue signal by a digital to analogue converter (DAC) and the DAC output signal fed-back to the input of the ADC, wherein the current through the input resistor is controlled by the output signal of the DAC that is configured to contain a DC bias voltage that is substantially equal to the unknown DC bias voltage in the input signal. In this manner, the proposed interface circuit allows an input signal containing an unknown DC bias voltage to be DC coupled via an input resistor to a signal processing circuit, thus removing a need for a large AC coupling capacitor to be used in many existing circuits and thereby significantly simplifying the design and reducing application cost.

Although examples of the invention are described with reference to a use in an electret microphone implementation, it is envisaged that the concepts herein described are equally applicable to micro-electrical-mechanical system (MEMS) microphone or indeed any other sensor that uses a relatively large DC voltage supply.

In some examples, the ADC may be a sigma-delta analogue to digital converter (SDADC), the output of the SDADC being digitally filtered and fed-back to its input, via a second sigma-delta modulator (SDM) with an N-bit DAC and passive components. In some examples, the N-bit DAC may be advantageously implemented as a 1-bit DAC. The current through the input resistor is again determined by the DAC output signal, which contains a DC bias component equal to that in the input (source) signal. In this manner, a 1-bit noise shaping circuit may be used in place of a multi-bit DAC, thereby reducing the complexity of the circuit.

In some examples, a loop filter of a SDADC may be implemented using a transconductance amplifier and feedback capacitor, hence forming a simple active integrator. In this manner, it is possible to realise a loop filter using a standard operational amplifier or an operational transconductance amplifier (OTA). In some examples, the loop filter of the SDADC may be implemented using a grounded capacitor, the output voltage of which is used to feed further active integrators. In this manner, it is possible to utilise a simple grounded capacitor circuit whilst also creating sufficient noise shaping of the output signal. Alternatively, in some examples, the loop filter of the SDADC may be implemented whereby the output of the grounded capacitor may be fed to further passive stages. In this manner, it is possible to realise a much more simplified circuit. In all examples, it is envisaged that it is possible to add more filtering stages to increase the order of the noise shaping.

In some examples, a DC loop gain of the interface circuit may be configured to be higher than an AC loop gain at audio frequencies below approximately 20 Hz. In this manner, it is possible to optimise the interface circuit for processing acoustic signals.

In some examples the signal source is a microphone, such as an electret-microphone or MEMS. In this manner, it is possible to generate a DC offset voltage in an interface circuit that is suitable for interfacing to a wide range of standard microphones, including electret-microphone or MEMS.

Examples of the invention provide an interface circuit that further includes a parallel path for processing the output signal of the SDADC using a secondary Sigma Delta Modulator, the output of which is fed back to the input of the SDADC via a low pass filter and a coupling resistor. A comparable method is also described. In this manner by employing a sigma delta ADC and SDM it is possible to provide a circuit capable of generating a DC bias voltage that can be used to remove an unknown DC bias from an input signal.

Although examples of the invention are described with reference to a microphone interface circuit, it is envisaged that in other examples, the teachings of the invention may be used in any applications where it is necessary to interface a signal processing circuit to a signal source containing an unknown DC bias or offset voltage such as in instrumentation or amplification circuits.

Figure 2:
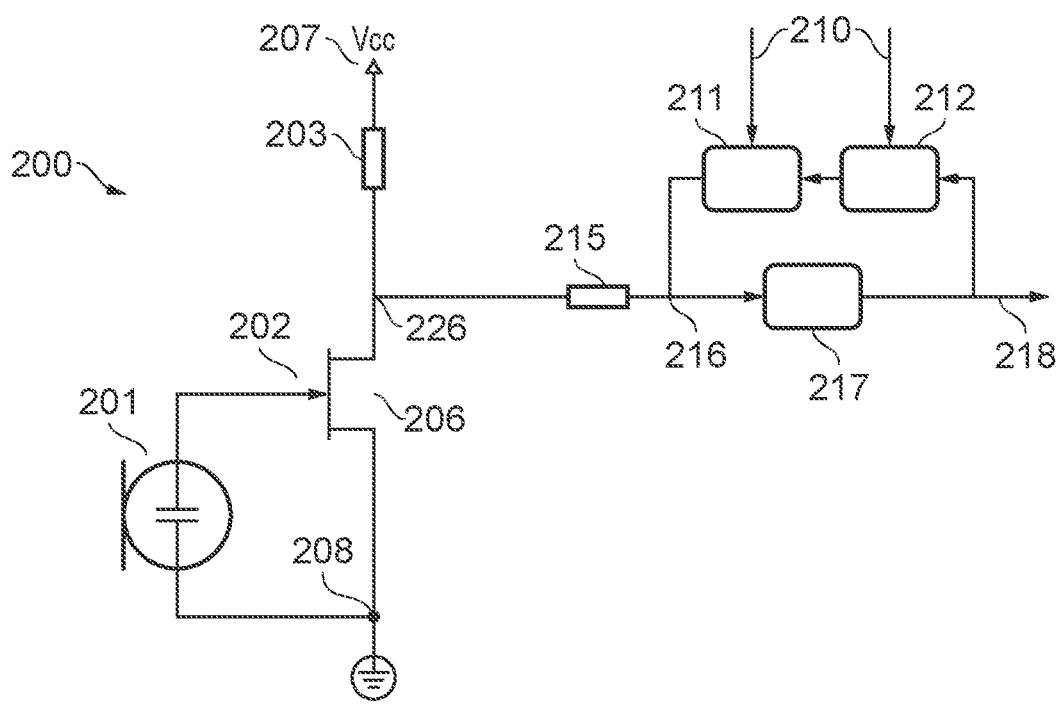
FIG. 2 illustrates one example of an interface circuit, adapted according to example embodiments of the invention.

Referring first to FIG. 2, an example of a microphone interface circuit 200 according to some examples of the invention is illustrated. In this example, the signal source is an electret microphone 201. The output 202 of the capacitive transducer being buffered by a JFET 206, which is commonly integrated directly into the microphone. In examples of the invention, the gate of the JFET 206 acts as a high resistance buffer, thereby preventing the capacitive electret transducer 201 from being electrically loaded. The JFET 206 requires a supply voltage (Vcc) 207, which is coupled to a drain of the JFET 206 via a drain resistance 203. Thus, the output of the JFET 206 contains both the transducer output signal 201 and a large DC bias voltage. The output is then provided to a signal processing circuit of the interface circuit 200, which comprises a series resistor 215 and an ADC 217. A feedback path coupling the output 218 of the ADC 217 to the input of the ADC 217 includes a digital filter 212 and a feedback DAC 211.

In this example, the current through the series resistor 215 is determined by the output 216 of the feedback DAC 211 (in this case a current). To provide the correct current, and make the correct level-shift i.e., to correct for the unknown DC bias present in the input signal 226, the feedback DAC 211 and preceding digital filter 212 in the feedback pack are driven by clock signals 210, such that that the digital filter 212 filters the ADC 217 output 218. This digital filter 212 has large gain at both DC and low frequencies, this characteristic being necessary in order to reject the DC component of the main loop.

At a gain cross-over point, the AC loop and the DC loop have equal gain. At low frequencies (e.g., for audio <20 Hz), the DC loop has more gain than the AC loop. In the audio bandwidth range i.e., the useful signal bandwidth, digital filter 212 should ideally have no gain in order to prevent the audio signal itself from being regulated away at the ADC output. Furthermore, the characteristics of the feedback DAC 211 and the digital filter 212 are solely dependent upon the clock frequency $f_s$ 210. Hence the characteristics of the digital filter 212, which are critical for the correct functioning of the interface circuit 200, are predictable and stable.

The interface circuit 200 thus corrects for the large unknown DC component in the output signal 226 of the JFET 206, and hence prevents the input of the ADC 217 from being overloaded by the large DC bias voltage from the microphone's electret transducer 201.

In current practical implementations, it is known that different microphones may be employed with different ICs.

Thus, not knowing a DC bias level can cause problems. An alternative solution to say use a programmable DC shift still needs to ensure that the DC will not change over product's lifetime. In the examples of the invention, the configured DC loop achieves this long-term benefit, in that it tracks the DC over the product's lifetime.

Figure 3:
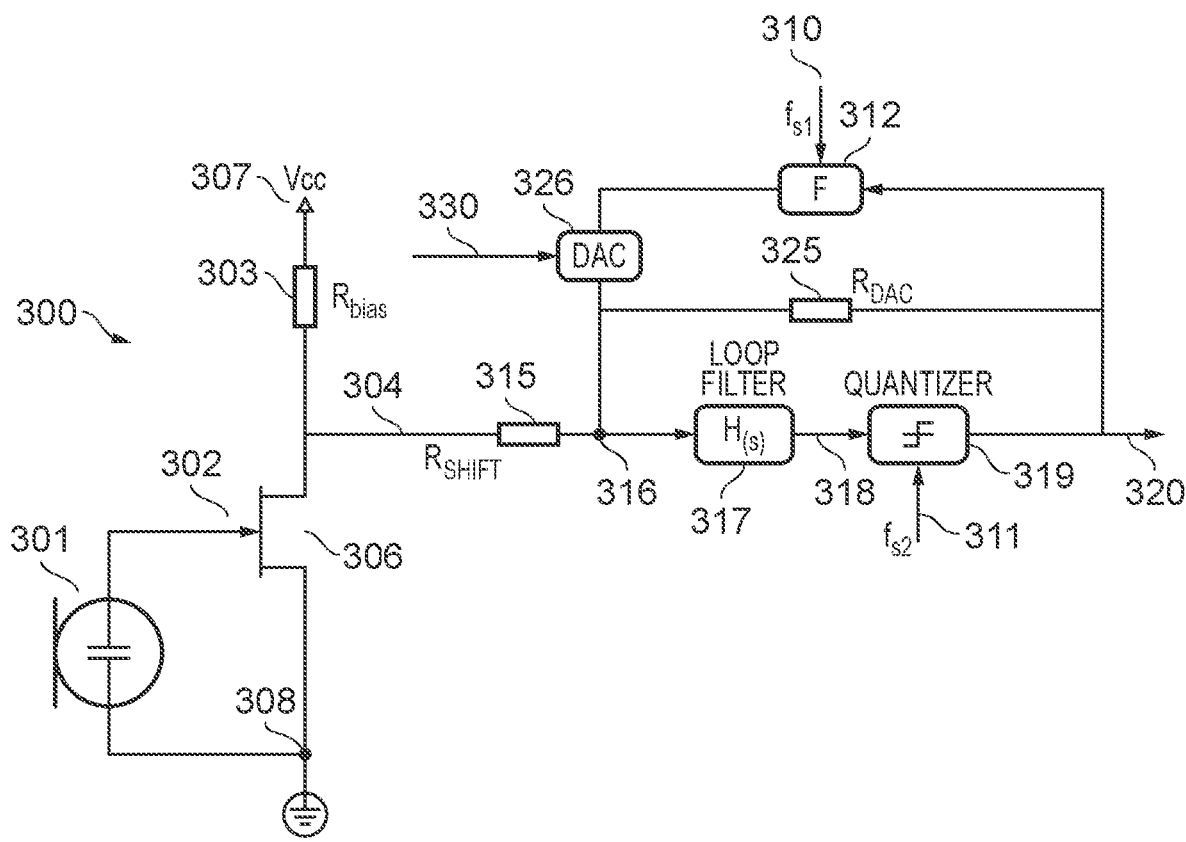
FIG. 3 illustrates one example of an interface circuit, according to example embodiments of the invention.

FIG. 3 illustrates a further example of an interface circuit 300, such as a microphone interface circuit, according to some example embodiments of the invention. In this example, the output 302 of electret microphone 301 is again buffered by JFET 306 in order to produce output voltage 304, which is fed into the following signal processing circuit via input resistance 315.

In this example, the DC loop is now integrated into a SDADC. If the DC loop is ignored for the moment, the SDADC comprises the level-shift series resistor 315, the feedback resistor 325 (Rdac), a loop-filter (H) 317 and a quantizer 319 (which in this case is a 1-bit quantizer). The output of the quantizer 319 is controlled by the timing reference frequency (fs2) 311. As a SDADC is a feedback loop, its input node 316 at the input of loop-filter (H) 317 can be assumed to be a virtual ground. The input signal 304 from the microphone 301 produces a current to the virtual ground node, which is compensated by the current coming from the 1-bit DAC 326 through feedback resistor Rdac 325. The output 320 of quantizer 319 switches between '0' and a reference voltage, in general, its supply voltage Vdd, the DAC then switching between 0V and Vref and on average outputting 0.5Vref, provided that the input signal is DC free, compared to 0.5Vref.

In FIG. 3, a resistive DAC 326 is used of which the resistors are connected to ground or a signal Vref, hence providing the correct current, based on the incoming signal from digital loop filter (F) 312, where the operation of the digital loop filter (F) 312 is controlled by the timing reference frequency (fs1) 310. It is envisaged that in other implementations that the required current may be alternatively provided using current sources. As described previously, the DC loop has a lot of gain at low frequencies and DC, and therefore is able to provide the DC current through the secondary DAC 326 which is clocked at a frequency 330. In some examples, the quantizer timing reference frequency (fs2) 311 may not be at the same frequency as the DC loop's timing reference frequency (fs1) 310, albeit that in most practical implementations of the interface circuit 300 it is likely that the quantizer timing reference frequency (fs2) 311 will be at the same frequency as the DC loop's timing reference frequency (fs1) 310. As the DC loop has a lot of gain at DC, the DC component will be small at the output of the ADC 320 (which comprises the loop-filter (H) 317 and quantizer 319), and only a very small part of the ADC dynamic range is lost.

Figure 4:
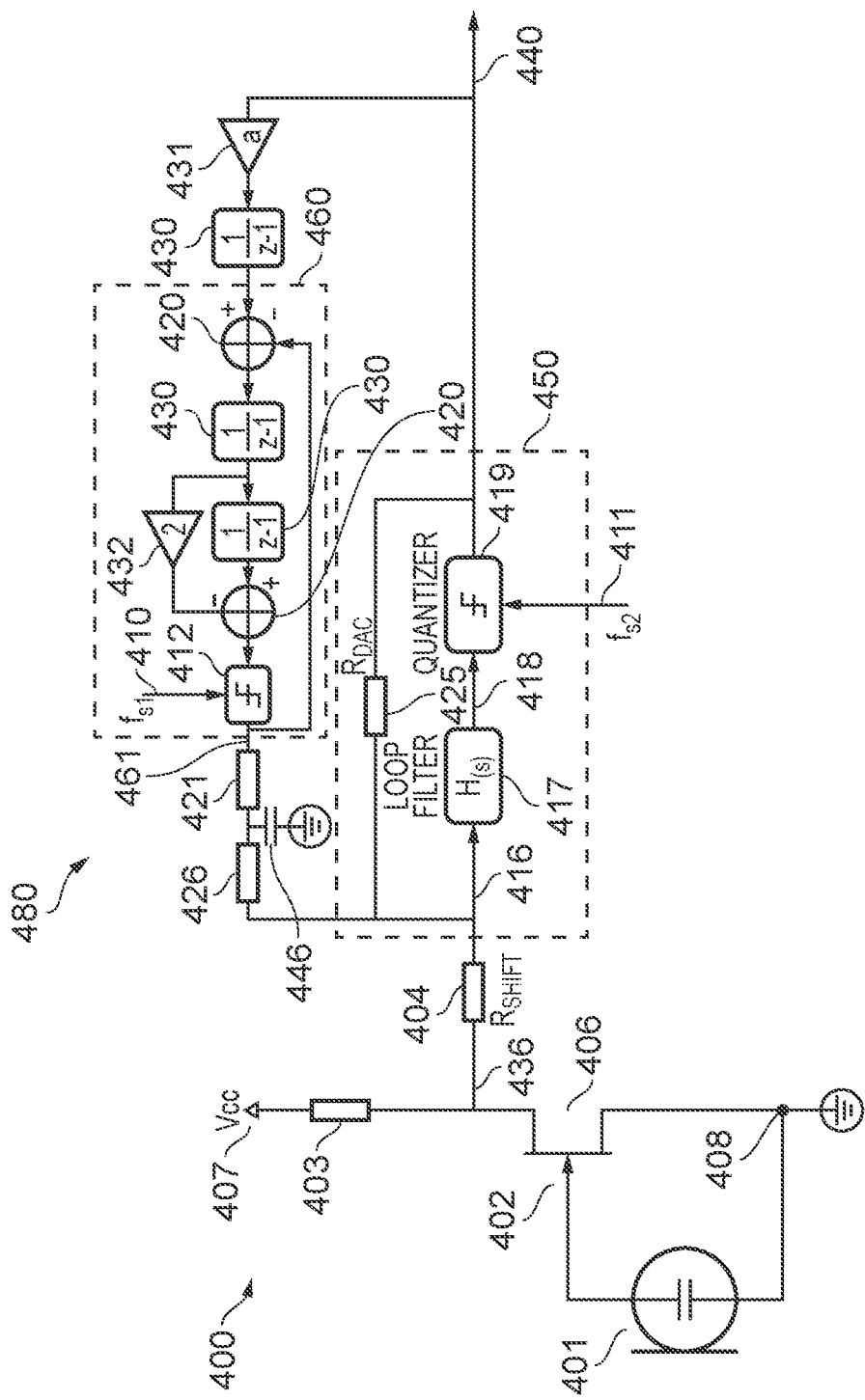
FIG. 4 illustrates a further example of an interface circuit, according to example embodiments of the invention.

FIG. 4 illustrates a further example of a microphone interface circuit 400, according to example embodiments of the invention. FIG. 4 shows an extension of the arrangement in FIG. 3. In this example, the microphone interface circuit 400 is connected to an ADC system 480 that includes a main sigma delta ADC 450, coupled to a DC digital filter 'F' and a noise shaping circuit 460 functioning as part of a DAC in a feedback path.

In this example of microphone interface circuit 400, the output 402 of electret microphone 401 is again buffered by JFET 406 in order to produce output voltage 436, which is fed into the following signal processing circuit via input resistance 404. In this example, the DC loop is now integrated into a SDADC. If the DC loop is ignored for the moment, the SDADC consists of the bias resistor 403, and at the same time the level-shift series resistor 404, the feedback resistor 425 (Rdac), a loop-filter (H) 417 and a quantizer 419 (which in this case is a 1-bit quantizer). The output of the quantizer 419 is controlled by the timing reference frequency 411. As a SDADC is a feedback loop, its input node 416 at the input of loop-filter (H) 417 can be assumed to be a virtual ground. The input signal 404 from the microphone 401 produces a current to the virtual ground node, which is compensated by the current coming from noise shaping circuit 460. This output 440 of quantizer 419 switches between '0' and a reference voltage Vref, and on average provides 0.5Vref, provided that the input signal is DC free, compared to 0.5Vref.

In this case the DAC 326 in FIG. 3 is replaced by a noise shaping circuit 460 providing, in this example, a 1-bit output 461. In this example, the noise shaping circuit 460 includes a first subtraction circuit (or component or logic) 420, receiving the signal from DC digital filter 'F', implemented as a simple integrator stage 430 multiplied by coefficient "a" 431, the coefficient "a" setting the unity gain of DC digital filter 'F' and subtracting the 1-bit output 461 from this received signal. The first subtraction circuit (or component or logic) 420 provides the subtracted signal to a second integrator stage 430, which outputs an integrated signal. A second subtraction circuit (or component or logic) 420 subtracts the integrated signal via doubler circuit 432 from a further (third) integrator stage 430 that is fed from the second integrator stage 430. The output of the second subtraction circuit (or component or logic) 420 is input to a second quantizer 412 that is controlled by timing reference frequency (fs1) 410 and produces 1-bit output 461. In some examples, it is envisaged that the noise shaping circuit 460 may be run at a lower frequency than the fs2 411 of the quantizer 419 and the 1/(z-1) filter 430, as this 1/(z-1) filter 430 has a very low cut-off frequency and aliasing of high frequency noise might not be that large. In this manner, running at a lower frequency may provide a power advantage, dependent upon the exact design of the loop parameters.

The 1-bit output 461 of the secondary sigma delta modulator (SDM) noise shaping circuit 460, is fed back to the sigma delta ADC virtual ground at input node 416 by resistors RdacDC1 426 and RdacDC2 421. In some examples, optional capacitor 446 may be used to limit the amount of quantization noise at the output of the noise shaping circuit 460, thereby preventing it from impacting the main loop of the main sigma delta ADC 450, hence avoiding overload and loss of dynamic range of the main sigma delta ADC 450. In other examples, it is envisaged that optional capacitor 446 may be used dependent upon the loop parameters of the design.

In the particular example of FIG. 4, the DC digital filter 'F' may be implemented as a simple integrator stage 430 multiplied by a coefficient "a" 431, the coefficient "a" setting the unity gain of DC digital filter 'F'. At the cross over point the DC loop (from output 440 to input node 416) including noise shaping circuit 460, integrator stage 430, coefficient "a" 431 and resistors 421 and 426, has the same gain as the normal feedback loop main sigma delta ADC 450 (fed through feedback resistor Rdac 425). In essence, the resistors 421, 426 are implementing the digital to analogue conversion (DAC) and the noise shaping circuit 460 is simply performing a conversion of the fed back output signal 440. For example, the gain of the noise shaping circuit 460 is equal to '1', in this example. At lower frequencies, signals will be rejected by the DC loop, whilst at higher frequencies, beyond the unity gain of the DC loop, the signal will node 41 through the main sigma delta ADC 450. For example, for audio this transition point could be 20 Hz. The filtering of the 1-bit output 218 generates a multi-bit word at the output of the filter 212. To avoid the need for a multi-bit feedback DAC (because of its linearity issues) in the feedback loop, a 1-bit noise shaping circuit 460 may be used. It quantizes the digital output signal to 1-bit and feeds back the error into the additional fully-digital noise shaping loop. In this way a 1-bit feedback DAC can be used in the DC path, which is always linear.

Figure 5:
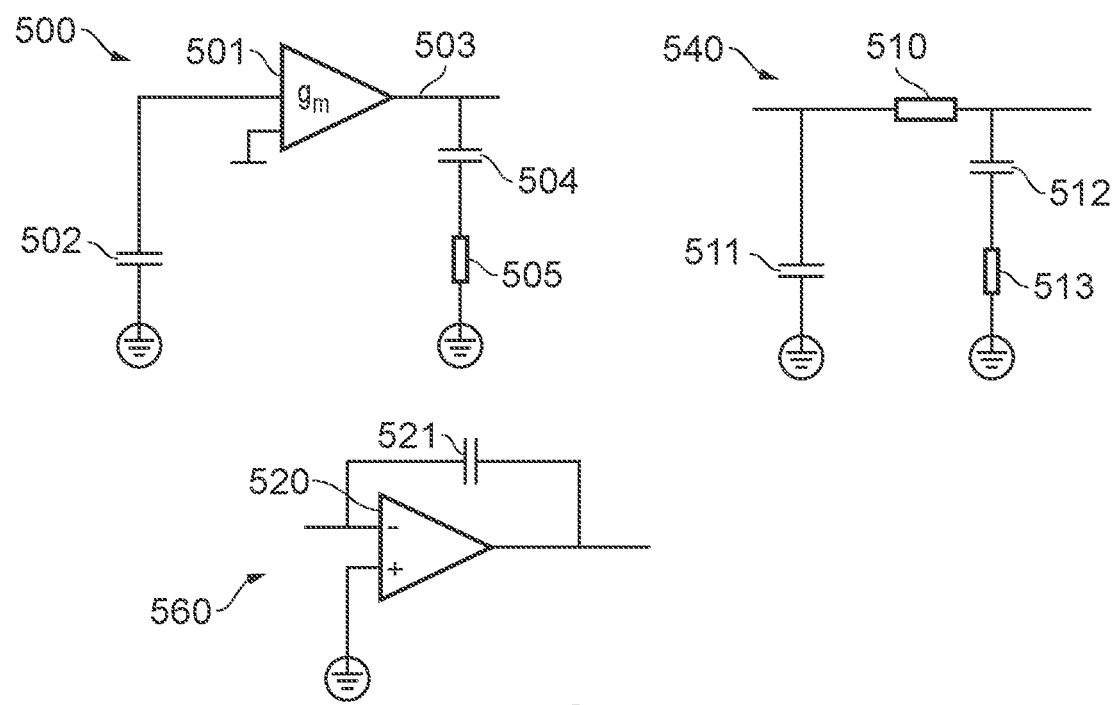
FIG. 5 illustrates three optional example implementations of a loop transfer function, according to example embodiments of the invention.

FIG. 5 illustrates three optional example implementations for a loop filter H (S) 417, according to some examples of the invention. In a first inverting example 560, the loop filter H (s) 417 can be implemented with a local virtual ground, for example an operational amplifier (op-amp) 520 with feedback capacitor 521, which makes it an integrator. Alternatively, in a second example 500, a capacitor to ground 502 at the input of an operational transconductance amplifier (OTA) is employed as is common in passive sigma delta ADCs. Here, the capacitor voltage is part of an active integrator e.g., Gm-C integrators 501, with an output 503 having a resistive 505-capacitive 504 (RC) stage. These integrator circuits can be followed, for example, by multiple integrator stages or circuits, in order to create sufficient noise shaping.

Alternatively, in a third non-inverting example 540, a capacitor to ground 511, is employed as is common in passive sigma delta ADCs. Here, the capacitor voltage feeds a passive RC stage that includes series resistor 510 and a resistive 513-capactive 512 (RC) stage.

Clearly, it is envisaged in such examples that non-inverting and inverting amplifier configurations must be taken into account.

Although three basic alternative implementations for loop filter $H_{(s)}$ 417 are shown, it is envisaged that these examples can be configured as higher-order loop filters, as is common in sigma delta ADCs.

Figure 6:
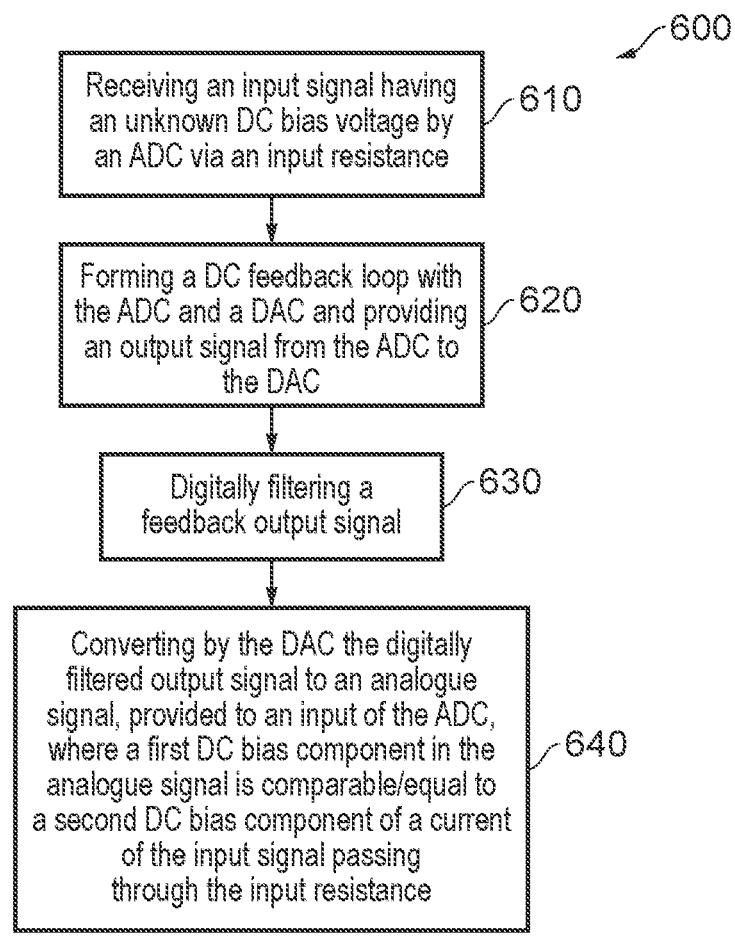
FIG. 6 illustrates an example flowchart of an interface circuit for removing an unknown DC bias voltage from an input signal, adapted according to example embodiments of the invention.

FIG. 6 illustrates an example flowchart 600 of an interface circuit for removing an unknown DC bias voltage from an input signal, adapted according to example embodiments of the invention. The flowchart starts at 610, with receiving the input signal having an unknown DC bias voltage (e.g., DC bias voltage 207) by an analogue to digital converter, ADC, (e.g., ADC 217, 450) of the interface circuit via an input resistance (e.g., input resistance 215). At 620, the flowchart includes forming a DC feedback loop with the ADC and a digital to analogue converter, DAC, (e.g., DAC 211) and providing an output signal (e.g., output signal 218, 440) from the ADC to the DAC. At 630, the flowchart includes digitally filtering a feedback output signal. At 640, the flowchart includes converting, by the DAC the digitally filtered feedback output signal to an analogue signal that is provided to the input of the ADC, wherein the analogue signal comprises a DC bias component that is comparable to a DC bias component of a current of the input signal passing through the input resistor.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals. Those skilled in the art will recognize that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above-described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. Also, for example, in one embodiment, the illustrated examples may be implemented as circuitry located on a single integrated circuit or within a same device.

In some examples, the various components within the interface circuit can be realized in discrete or integrated component form, with an ultimate structure therefore being an application-specific or design selection. As the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention. A skilled artisan will appreciate that the level of integration of interface circuits or components may be, in some instances, implementation-dependent.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

I claim:

1. An interface circuit comprising:
an analogue to digital converter, ADC, having an input configured to receive an input signal having an unknown DC bias voltage via an input resistance and provide an output signal to an ADC feedback loop;
the ADC feedback loop comprising a digital filter arranged to digitally filter the feedback output signal, and
a digital to analogue converter, DAC, forming a DC feedback loop with the filter and arranged to convert the digitally filtered fed-back output signal to an analogue signal that is provided to the input of the ADC, wherein the analogue signal that is provided to the input of the ADC is arranged to comprise a DC bias component that is substantially equal to a DC bias component of a current of the input signal passing through the input resistor,
wherein the ADC is a sigma-delta ADC and the ADC feedback loop further comprises an AC feedback loop comprising at least one resistor, Rdac, connecting an output of the ADC to the input of the ADC,
wherein at a crossover frequency, a DC feedback loop gain is substantially equal to an AC feedback loop gain.

2. The interface circuit of claim 1 wherein the input signal having an unknown DC bias voltage whereby the signal source is an input audio signal from an electret microphone or a micro-electrical-mechanical system, MEMS, microphone, or a signal source with a large DC bias.

3. An interface circuit, comprising:
an analogue to digital converter, ADC, having an input configured to receive an input signal having an unknown DC bias voltage via an input resistance and provide an output signal to an ADC feedback loop;
the ADC feedback loop comprising a digital filter arranged to digitally filter the feedback output signal, and
a digital to analogue converter, DAC, forming a DC feedback loop with the filter and arranged to convert the digitally filtered fed-back output signal to an analogue signal that is provided to the input of the ADC, wherein the analogue signal that is provided to the input of the ADC is arranged to comprise a DC bias component that is substantially equal to a DC bias component of a current of the input signal passing through the input resistor,
wherein the ADC is a sigma-delta ADC and the ADC feedback loop further comprises an AC feedback loop comprising at least one resistor, Rdac, connecting an output of the ADC to the input of the ADC,
wherein at lower frequencies signals are rejected by the DC loop and at frequencies higher than the crossover frequency between the AC feedback loop and the DC feedback loop, the output signal passes through the sigma-delta ADC.

4. An interface circuit, comprising:
an analogue to digital converter, ADC, having an input configured to receive an input signal having an unknown DC bias voltage via an input resistance and provide an output signal to an ADC feedback loop;
the ADC feedback loop comprising a digital filter arranged to digitally filter the feedback output signal, and
a digital to analogue converter, DAC, forming a DC feedback loop with the filter and arranged to convert the digitally filtered fed-back output signal to an analogue signal that is provided to the input of the ADC, wherein the analogue signal that is provided to the input of the ADC is arranged to comprise a DC bias component that is substantially equal to a DC bias component of a current of the input signal passing through the input resistor,
wherein the ADC is a sigma-delta ADC and the ADC feedback loop further comprises an AC feedback loop comprising at least one resistor, Rdac, connecting an output of the ADC to the input of the ADC, wherein the ADC is a sigma-delta ADC and the DC loop of the ADC feedback loop comprises:
a gain stage arranged to amplify the fed-back output signal of the sigma-delta ADC and provide an amplified fed-back output signal to the digital filter; and
the DAC is a noise shaping circuit connected to the digital filter, and arranged to provide the analogue signal to the input of the ADC,
wherein the noise shaping circuit is a second sigma delta modulator configured as a N-bit DAC, arranged to feed back the output signal to the input of the sigma delta ADC via the at least one resistor Rdac.

5. An interface circuit, comprising:
an analogue to digital converter, ADC, having an input configured to receive an input signal having an unknown DC bias voltage via an input resistance and provide an output signal to an ADC feedback loop;
the ADC feedback loop comprising a digital filter arranged to digitally filter the feedback output signal, and
a digital to analogue converter, DAC, forming a DC feedback loop with the filter and arranged to convert the digitally filtered fed-back output signal to an analogue signal that is provided to the input of the ADC, wherein the analogue signal that is provided to the input of the ADC is arranged to comprise a DC bias component that is substantially equal to a DC bias component of a current of the input signal passing through the input resistor,
wherein the ADC is a sigma-delta ADC and the ADC feedback loop further comprises an AC feedback loop comprising at least one resistor. Rdac, connecting an output of the ADC to the input of the ADC, wherein the ADC is a sigma-delta ADC and the DC loop of the ADC feedback loop comprises:
a gain stage arranged to amplify the fed-back output signal of the sigma-delta ADC and provide an amplified fed-back output signal to the digital filter; and
the DAC is a noise shaping circuit connected to the digital filter, and arranged to provide the analogue signal to the input of the ADC,
wherein an output of the noise shaping circuit comprises a filtering DAC arranged to limit an amount of quantization noise at the output of the noise shaping circuit.

6. An interface circuit, comprising:
an analogue to digital converter, ADC, having an input configured to receive an input signal having an unknown DC bias voltage via an input resistance and provide an output signal to an ADC feedback loop;

the ADC feedback loop comprising a digital filter arranged to digitally filter the feedback output signal, and a digital to analogue converter, DAC, forming a DC feedback loop with the filter and arranged to convert the digitally filtered fed-back output signal to an analogue signal that is provided to the input of the ADC, wherein the analogue signal that is provided to the input of the ADC is arranged to comprise a DC bias component that is substantially equal to a DC bias component of a current of the input signal passing through the input resistor, wherein the ADC is a sigma-delta ADC and the ADC feedback loop further comprises an AC feedback loop comprising at least one resistor, Rdac, connecting an output of the ADC to the input of the ADC, wherein the ADC is a sigma-delta ADC and the DC loop of the ADC feedback loop comprises:

a gain stage arranged to amplify the fed-back output signal of the sigma-delta ADC and provide an amplified fed-back output signal to the digital filter; and the DAC is a noise shaping circuit connected to the digital filter, and arranged to provide the analogue signal to the input of the ADC, wherein the sigma-delta ADC comprises an input node arranged to be a virtual ground node and receive the analogue signal from the DAC and receive the input signal having an unknown DC bias voltage where a current in the analogue signal is compensated by the current coming from the DAC.

7. The interface circuit of claim 6 wherein the sigma-delta ADC comprises a loop filter for filtering a signal of a combination of the input signal having an unknown DC bias voltage and the analogue signal and a quantizer arranged to provide an output signal that switches between a logic '0' and a supply voltage.

8. The interface circuit of claim 7 wherein the loop filter is implemented by at least one of: a transconductance amplifier or operational amplifier and a feedback capacitor connecting an output of the transconductance amplifier to an inverting input of the transconductance amplifier.

9. The interface circuit of claim 7 wherein the loop filter is implemented by a transconductance amplifier having an input connected to a grounded capacitor and an output connected to a shunt resistor-capacitor stage.

10. The interface circuit of claim 7 wherein the loop filter is implemented by a grounded shunt capacitor coupled to a series resistance and a shunt resistor-capacitor stage.

11. A method for removing an unknown DC bias voltage from an input signal the method comprising, at an interface circuit:

receiving the input signal having an unknown DC bias voltage by an analogue to digital converter, ADC, of the interface circuit via an input resistance;

forming a DC feedback loop with the ADC and a digital to analogue converter, DAC, and providing an output signal from the ADC to the DAC;

digitally filtering a fed-back output signal, and converting, by the DAC the digitally filtered fed-back output signal to an analogue signal that is provided to the input of the ADC, wherein the analogue signal comprises a DC bias component that is substantially equal to a DC bias component of a current of the input signal passing through the input resistor, wherein the ADC is a sigma-delta ADC and the ADC feedback loop further comprises an AC feedback loop comprising at least one resistor, Rdac, connecting an output of the ADC to the input of the ADC, wherein at a crossover frequency, a DC feedback loop gain is substantially equal to an AC feedback loop gain.

12. A method for removing an unknown DC bias voltage from an input signal the method comprising, at an interface circuit:

receiving the input signal having an unknown DC bias voltage by an analogue to digital converter, ADC, of the interface circuit via an input resistance;

forming a DC feedback loop with the ADC and a digital to analogue converter, DAC. and providing an output signal from the ADC to the DAC;

digitally filtering a fed-back output signal;

converting, by the DAC the digitally filtered fed-back output signal to an analogue signal that is provided to the input of the ADC, wherein the analogue signal comprises a DC bias component that is substantially equal to a DC bias component of a current of the input signal passing through the input resistor, wherein the ADC is a sigma-delta ADC and the ADC feedback loop further comprises an AC feedback loop comprising at least one resistor, Rdac, connecting an output of the ADC to the input of the ADC;

rejecting at lower frequencies signals by the DC loop; and allowing output signals to pass through the sigma-delta ADC at frequencies higher than the crossover frequency between the AC feedback loop and the DC feedback loop.

13. A method for removing an unknown DC bias voltage from an input signal the method comprising, at an interface circuit:

receiving the input signal having an unknown DC bias voltage by an analogue to digital converter, ADC, of the interface circuit via an input resistance;

forming a DC feedback loop with the ADC and a digital to analogue converter, DAC. and providing an output signal from the ADC to the DAC;

digitally filtering a fed-back output signal;

converting, by the DAC the digitally filtered fed-back output signal to an analogue signal that is provided to the input of the ADC, wherein the analogue signal comprises a DC bias component that is substantially equal to a DC bias component of a current of the input signal passing through the input resistor. wherein the ADC is a sigma-delta ADC and the ADC feedback loop further comprises an AC feedback loop comprising at least one resistor, Rdac, connecting an output of the ADC to the input of the ADC.

wherein the ADC is a sigma-delta ADC, the method further comprising:

arranging a gain stage in the DC loop of the ADC feedback loop to amplify the fed-back output signal of the sigma-delta ADC;

providing an amplified fed-back output signal to the digital filter;

coupling a noise shaping circuit of the DAC to the digital filter; and providing the analogue signal to the input of the ADC, wherein the noise shaping circuit is a second sigma delta modulator configured as a N-bit DAC, and the method further comprises:

feeding back the output signal to the input of the sigma delta ADC via the at least one resistor Rdac.

14. A method for removing an unknown DC bias voltage from an input signal the method comprising, at an interface circuit:

receiving the input signal having an unknown DC bias voltage by an analogue to digital converter, ADC, of the interface circuit via an input resistance;

forming a DC feedback loop with the ADC and a digital to analogue converter, DAC. and providing an output signal from the ADC to the DAC;

digitally filtering a fed-back output signal;

converting, by the DAC the digitally filtered fed-back output signal to an analogue signal that is provided to the input of the ADC, wherein the analogue signal comprises a DC bias component that is substantially equal to a DC bias component of a current of the input signal passing through the input resistor, wherein the ADC is a sigma-delta ADC and the ADC feedback loop further comprises an AC feedback loop comprising at least one resistor, Rdac, connecting an output of the ADC to the input of the ADC, wherein the ADC is a sigma-delta ADC, the method further comprising:
  arranging a gain stage in the DC loop of the ADC feedback loop to amplify the fed-back output signal of the sigma-delta ADC;
  providing an amplified fed-back output signal to the digital filter;
  coupling a noise shaping circuit of the DAC to the digital filter; and
  providing the analogue signal to the input of the ADC, wherein the method further comprises arranging an output of the noise shaping circuit to include a filtering DAC that limits an amount of quantization noise at the output of the noise shaping circuit.

* * * * *